(12) United States Patent
Chadha et al.

(10) Patent No.: US 6,253,355 B1
(45) Date of Patent: Jun. 26, 2001

(54) METHOD FOR FAST ESTIMATION OF STEP RESPONSE BOUND DUE TO CAPACITANCE COUPLING FOR RC CIRCUITS

(75) Inventors: Rakesh H. Chadha, Berkeley Heights; Foong-Charn Chang, New Providence; Lun Ye, Scotch Plains, all of NJ (US)

(73) Assignee: Agere Systems Guardian Corp., Allentown, PA (US)

(*) Notice: Subject to any disclaimer, the term of this patent is extended or adjusted under 35 U.S.C. 154(b) by 0 days.

(21) Appl. No.: 09/031,012

(22) Filed: Feb. 26, 1998

(51) Int. Cl.$^7$ ........................................... H04B 3/32
(52) U.S. Cl. ........................................... 716/5
(58) Field of Search ............... 395/500.06; 365/226; 716/5

(56) References Cited

U.S. PATENT DOCUMENTS 5,596,506 * 1/1997 Petschauer ............... 395/500.06

OTHER PUBLICATIONS

A. Rubino, N. Itazaki, X. Xu and K. Kinoshita, "An Approach to the Analysis and Detection of Crosstalk Faults in Digital VLSI Circuits", IEEE Trans. on Computer–Aided Design of Integrated Circuits and Systems, vol. 13, No. 3, p. 387, Mar. 1994.
J. Rubinstein, P. Penfield, Jr., M. A. Horowitz, "Signal Delay in RC Tree Networks", IEEE Trans. on Computer–Aided Design, vol. CAD–2, No. 3, p. 203, Jul. 1983.
T.–M. Lin and C. A. Mead, "Signal Delay in General RC Networks", IEEE Trans. on Computer–Aided Design, vol. CAD–3, No. 4, p. 331, Oct. 1984.
R. Gupta, B. Tutuianu, and L. T. Pileggi, "The Elmore Delay as a Bound for RC Trees with Generalized Input Signals", IEEE Trans. on Computer–Aided Design of Integrated Circuits and Systems, vol. 16, No. 1, p. 95, Jan. 1997.
D. Martin and N. C. Rumin, "Delay Prediction from Resistance–Capacitance Models of General MOS Circuits", IEEE Trans. on Computer–Aided Design, vol. 12, No. 7, p. 997, Jul. 1993.
A. Deng and Y–C. Shiau, "Generic Linear RC Delay Modeling for Digital CMOS Circuits", IEEE Trans. on Computer–Aided Design, vol. 9, No. 4, p. 367, Apr. 1990.
D. S. Gao, A. T. Yang and S. M. Kang, "Modeling and Simulation of Interconnection Delay and Crosstalks in High––Speed Integrated Circuits", IEEE Trans. on Circuits and Systems, vol. 37, No. 1, p. 1, Jan. 1990.
P. Feldmann and R. W. Freund, "Efficient Linear Circuit Analysis by Pade Approximation via the Lanczos Process", IEEE Trans. on Computer–Aided Design of Integrated Circuits and Systems, vol. 14, No. 5, p. 639, May 1995.
A. Vittal and M. Marek–Sadowska, "Crosstalk Reduction for VLSI", IEEE Transactions on Computer–Aided Design of Integrated Circuits and Systems, vol. 16, No. 3, p. 290, Mar. 1997.

(List continued on next page.)

Primary Examiner—Matthew Smith
Assistant Examiner—Thuan Do
(74) Attorney, Agent, or Firm—Henry T. Brendzel

(57) ABSTRACT

A method and a tool for quickly evaluating the circuit response of VLSI designs in the presence of parasitics assists in improving VLSI designs. Offending induced voltgages are quickly identified through a simple approximation procedure, and the circuit lines where such voltages are induced are marked for evaluation with tools that make an accurate assessment. When it is determined that these circuit lines do exceed predetermined thresholds, the circuit designer is alerted to the need to redesign the circuit or its layout. The tool disclosed considers each circuit line of the VLSI circuit, and with respect to each considered circuit line, computes an estimated peak voltage due to the parasitics. The computations are very simple, involving only a summation of terms, each of which involves a quotient of one RC product by a sum of two RC products.

18 Claims, 3 Drawing Sheets

OTHER PUBLICATIONS

K. L. Shepard and V. Narayanan, "Noise in Deep Submicron Digital Design", IEEE, p. 524, 1996.

S.-Y. Kim, N. Gopal, and L. T. Pillage, "Time–Domain Macromodels for VLSI Interconnect Analysis", IEEE Transactions on Computer–Aided Design of Integrated Circuits andSystems, vol. 13, No. 10, p. 1257, Oct. 1994.

D. S. Sylvester, C. Hu, O. S. Nakagawa and S.-Y. Oh, "An Analytical Crosstalk Model with Application to ULSI Interconnect Scaling" No Date.

S. D. Corey and A. T. Yang, "Interconnect Characterization Using Time–Domain Reflectometry", IEEE Trans. on Microwave Theory and Techniques, vol. 43, No. 9, p. 2151, Sep. 1995.

A. J. Rainal, "Transmission Properties of Balanced Interconnections", IEEE Trans. on Components, Hybrids, and Manufacturing Technology, vol. 16, No. 1, p. 137, Feb. 1993.

* cited by examiner

METHOD FOR FAST ESTIMATION OF STEP RESPONSE BOUND DUE TO CAPACITANCE COUPLING FOR RC CIRCUITS

BACKGROUND OF THE INVENTION

This invention relates to very large-scale integrated circuit (VLSI) design and, more particularly, to tools that assist in the design and creation of VLSI circuits.

Current designs of VLSIs include components that number in the millions. Obviously, when dealing with the design of such circuits it is necessary to employ automated tools in order to create, validate and improve the circuit designs and their layouts. Indeed, many tools are available in the art, and different tools cover different aspects of the VLSI circuit creation process, such as

- tools that assist in creating the VLSI circuit design,
- tools that prepare listings of elements and their connections, in preparations for other automated processes,
- tools that analyze the design,
- tools the simulate the circuit's operation,
- tools that create the circuit layout,
- tools that identify the parasitics circuit that corresponds to the circuit's design and layout, etc.

It is important to consider the circuit's parasitic capacitances and resistances because they degrade the circuit's performance and potentially can make the circuit fall outside its intended range of operation. An example of a tool which creates a circuit consisting of the parasitic elements of a given circuit (the "parasitics circuit") is called "Clover," which is marketed by the Design Automation Organization of Bell Labs, which is part of Lucent Technologies. Given a circuit design, "Clover" creates the parasitics circuit, expresses it in an established, standardized format, e.g., the "DSPF format , (where DSPF stands for Detailed Standards Parasitic Format), and makes it available for further analysis. Various prior art tools are available that analyze parasitics circuits, such as "SPICE," which currently is a public domain program.

The problem with current tools for analyzing parasitics circuits is that they are too slow; primarily because they perform all of the necessary calculations, and the number of the required calculations is staggering. The challenge is to quickly evaluate the step response of an analyzed parasitics circuit in order to expedite the overall design process.

SUMMARY

This invention provides a method and a tool for quickly evaluating the impact of parasitics on the functionality of VLSI designs. It quickly identifies, through a simple approximation procedure, the circuit lines where signals are induced by the parasitic capacitances and resistances. When these approximations are in excess of a predetermined threshold, the circuit lines are marked for evaluation with tools that make a more accurate assessment, and if it is determined that these circuit lines do exceed the predetermined thresholds, the circuit designer is alerted to the need to redesign the circuit or its layout.

The tool disclosed herein considers each circuit line of the VLSI circuit, and with respect to each considered circuit line, computes an estimated peak voltage due to the parasitics. The computations are very simple, involving only a summation of terms, each of which involves a quotient of one resistor-capacitor (RC) product by a sum of two RC products. Consequently, the estimate of the peak induced signal on a circuit line is obtained quickly.

DETAILED DESCRIPTION

Figure 1:
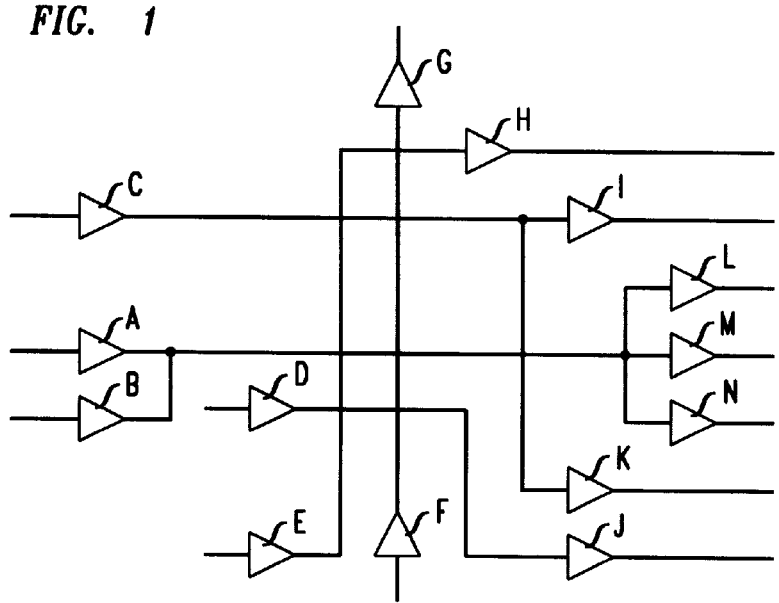
FIG. 1 illustrates a portion of a schematic diagram of a VLSI circuit.
Figure 2:
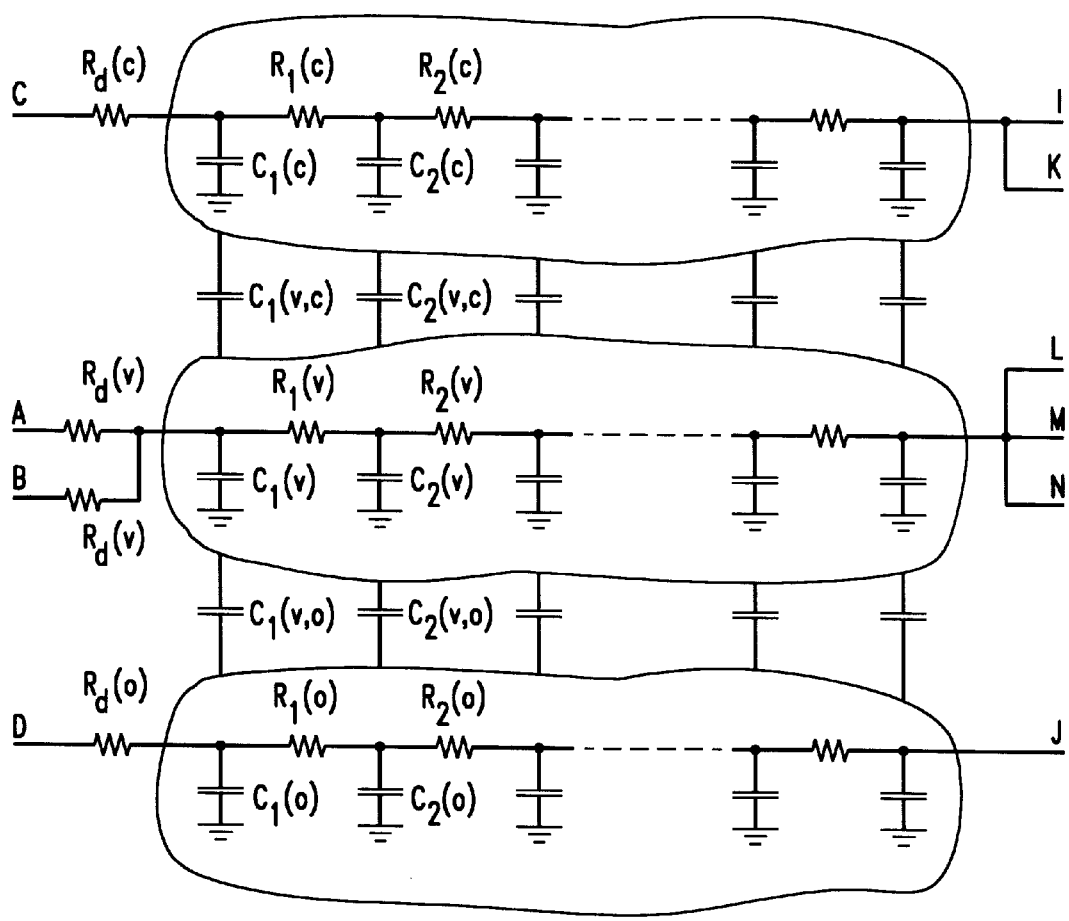
FIG. 2 presents a portion of the parasitics circuit associated with the schematic diagram of FIG. 1.

FIG. 1 presents an example of a VLSI layout schematic. It comprises gates A though G that drive circuit lines, and those lines are terminated at input terminals of gates H through N. It may be noted that the circuit lines of FIG. 1 run parallel to some circuit lines and perpendicular to other circuit lines. Since every circuit line has a) a resistance, b) capacitance to ground, and c) a coupling capacitance to many other lines, it is easy to envision the fact that there is another, hidden, circuit that is associated with the FIG. 1 circuit, which comprises those various resistances and capacitances. This disclosure refers to this circuit as the parasitics circuit. A portion of the parasitics circuit that is associated with the FIG. 1 circuit is shown in FIG. 2. Specifically, FIG. 2 shows a portion of the parasitics circuit for the line driven by gates A and B.

It may be observed that the circuit line driven by gates A and B is represented in FIG. 2 by a plurality of resistances with interposed capacitances connected to ground at the junction of each pair of resistances. This is the classic RC representation of a wire. The number of resistances is arbitrary because, theoretically, there is an infinite number of these resistances, and the value of each one of these resistances is infinitesimally small. The wire resistances of FIG. 2 are designated by $R_i(v)$, where v is the identity of the circuit line, and the total wire resistance for that line, $R(v)$, is the sum of the resistances. That is, $$R(v) = R_d(v) + \sum_{i=1}^{n} R_i(v), \qquad (1)$$

where $R_d(v)$ is the equivalent source resistance, and n is the number of the resistances that represent the circuit line. Similarly, with respect to the wire capacitance to ground, $$C(v) = \sum_{i=1}^{m} C_i(v), \qquad (2)$$

where v is the identity of the circuit line, $C_i(v)$ is the value of the individual capacitances of the circuit line to ground, and m is the number of such capacitances. With respect to the other sets of capacitances, i.e., capacitances that couple to other circuit lines, the equation is similar. That is, the total capacitance between circuit line v and circuit line j, $C(v,j)$, is $$\sum_{i=1}^{k} C_i(v, j)$$

where k is the number of capacitances that participate in the coupling between circuit line v and circuit line j. A total capacitance measure for circuit line v, is expressed by $$C_t(v) = C(v) + \sum_{j=1}^{M} C(v, j), \qquad (3)$$

where M is the number of lines that have a measurable effect on circuit line v.

In accordance with the approach disclosed herein, the estimated normalized peak voltage that is induced on circuit line v (the "victim" circuit line) by circuit line j (an "aggressor" circuit line) conforms to the equation $$e_{peak}(v, j) = \frac{k1 C(v, j) R(v)}{k2 C(v) R(v) + k3 C(j) R(j)}, \qquad (4)$$

where the factors k1, k2, and k3 are preselected constants. Finally, per force of the Superposition Theorem, the overall peak voltage is derived from $$e_{peak}(v) = \sum_{j=1}^{M} e_{peak}(v, j). \qquad (5)$$

Currently, we set the values of k1, k2, and k3 to 1. However, other artisans may find other values to be beneficial. Also, equation (4) can be generalized to be a quotient of sums of RC constants, as long as the number of terms in the numerator is lower than in the denominator.

The VLSI design assistance that equation 5 can provide is embodied in a software tool that includes a data gathering module, a computation module, and an assessment module. The tool is most advantageously installed in a digital computer and, under direction of a controller, interacts with other tools to provide the desired quick layout enhancement benefits.

Figure 3:
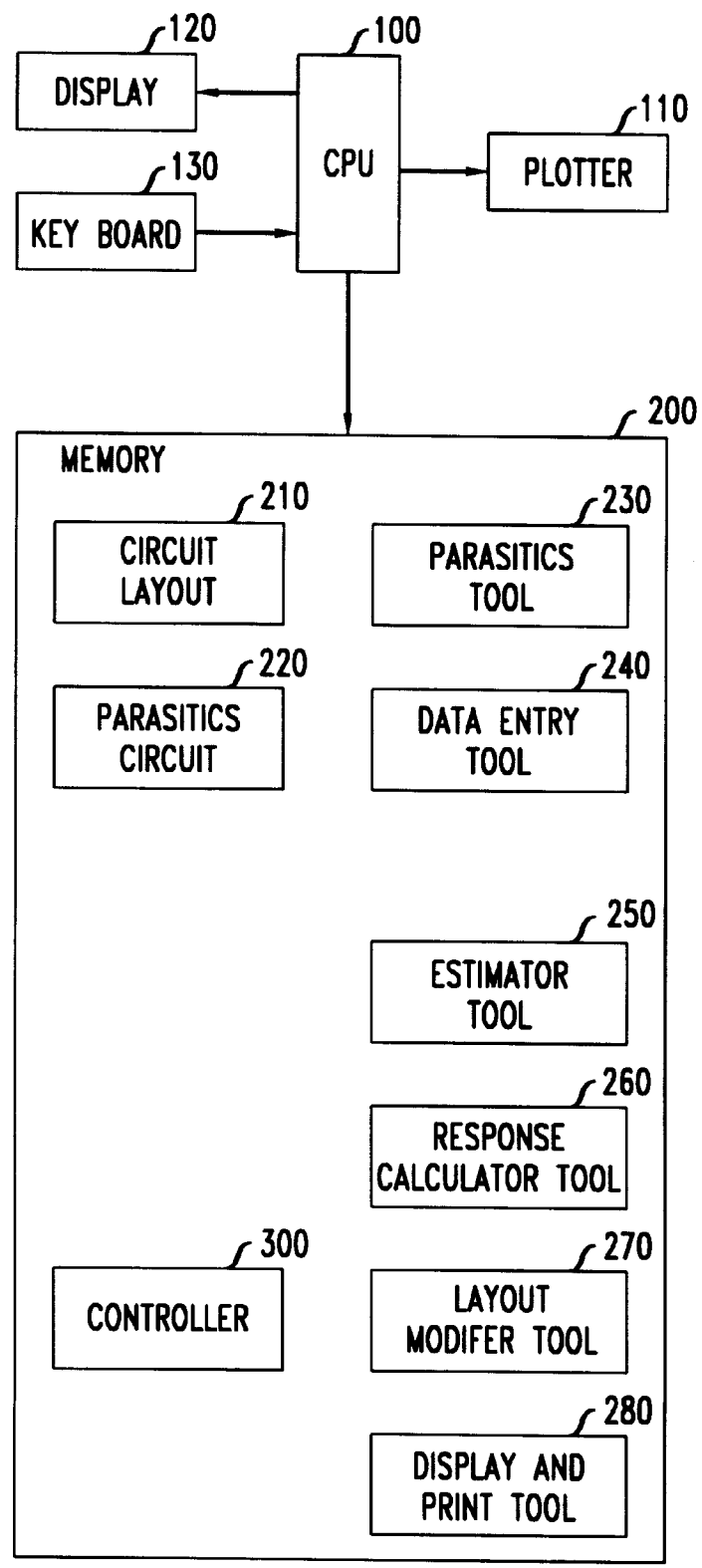
FIG. 3 shows a block diagram of apparatus in conformance with the principles disclosed herein.

FIG. 3 presents a general block diagram of such a digital computer arrangement. In FIG. 3, CPU 100 has a keyboard 130, a display 120, and an associated a plotter 110 that is adapted to plot images of integrated circuit layouts. Typically, those images are lithographically reduced to create masks which are used in the actual manufacturing of integrated circuits. Also associated with CPU 100 is a memory 200 which stores a controller 300, a representation of the integrated circuit's design and layout 210, and a representation of parasitics circuit 220 which corresponds to representation 210. In addition, memory 200 includes a number of tools that are employed in the creation of the integrated circuit layout and its image, under direction of controller 300. Illustratively, memory 200 includes data entry tool 240, parasitics circuit creation tool 230, estimator tool 250, response calculator tool 260, layout modifier tool 270, and display & print tool 280.

Data entry tool 240 can be any software module and associated hardware (such as a tape drive) that inserts data into memory 200 and thereby populates the memory portion devoted to circuit layout, i.e., memory segment 210. An example of such a tool is DRACULA, marketed by Cadence Design System.

Parasitics circuit creation tool 230 creates a representation of that circuit created solely from the parasitic capacitances and resistances that are expected to be found in the circuit represented in memory segment 210. As example of such a tool is "Clover" which, as indicated above, is a commercial tool.

Estimator tool 250 is a software module that, with assistance from controller 300, carries out the equation 4 and 5 calculations disclosed above.

Response calculator tool 260 evaluates the response of the parasitics circuit, but unlike estimator tool 250, it develops an accurate value for the expected response, as compared to a mere estimate. An example of such a tool is "SPICE".

Layout modifier tool 270 modifies the layout of the circuit being designed, and thereby changes circuit representation 210. The aim of tools 270 is to change the layout so as to reduce all voltages which are induced by the parasitic capacitances and resistances to a level below a preselected threshold. This tool may be simply a software module that displays circuit lines which contribute most of the induced voltages in those circuit lines where the induced voltage exceeds the above-mentioned threshold, e.g., on display 120. The tool then allows the user to change the position of those lines, the orientation of those lines, or even to change the actual circuit architecture, e.g., via keyboard 130; all in an effort to reduce the parasitic coupling.

Display & print tool 280 is a conventional utility that creates the image, or images which corresponds to the layout representation 210.

Figure 4:
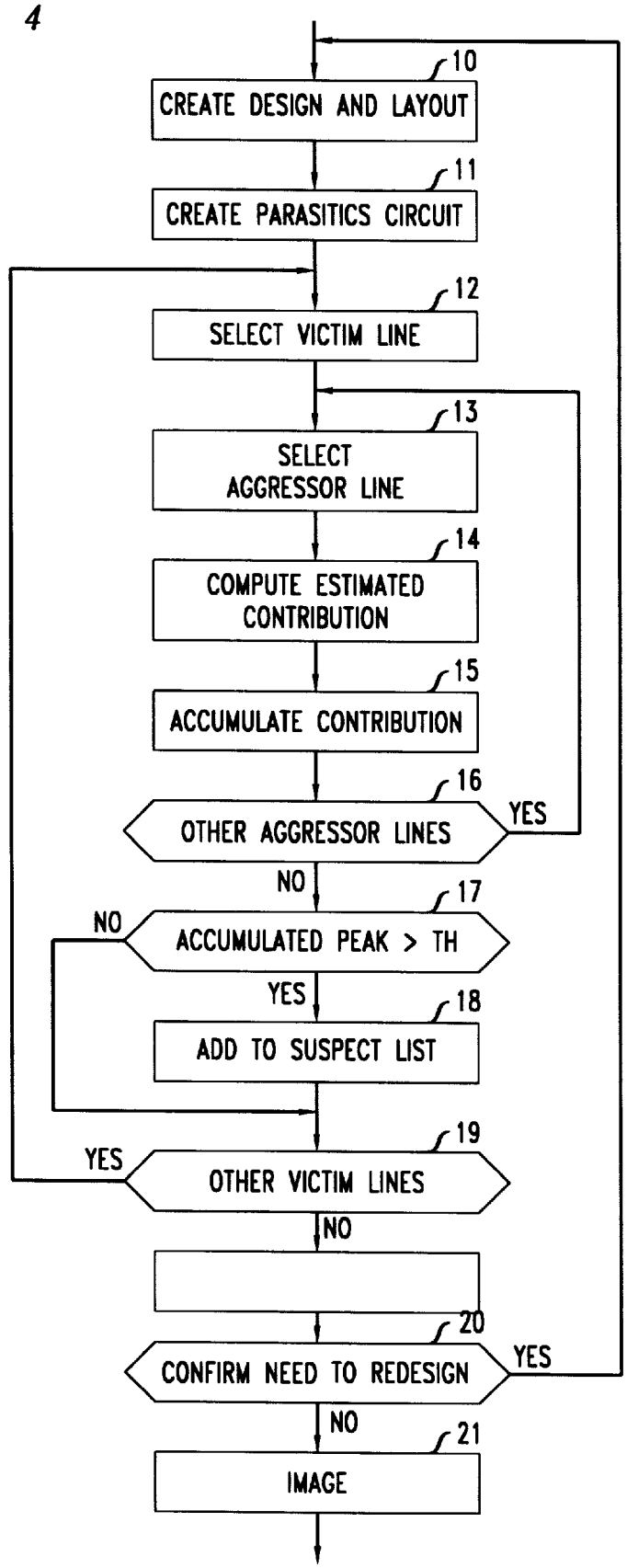
FIG. 4 presents a fi chart of a process for quickly estimating the step response of parasitics circuits.

FIG. 4 presents a flowchart of the process carried out, in accordance with the instant disclosure, under direction of controller 300. Block 10 creates/modifies the design and layout of the integrated circuit under consideration. The creating can be done in the processor of FIG. 3 (with a tool that is not described), or it can be done elsewhere. The modification is done with tool 280, as described below. The resultant circuit representation (210) is inserted by block 10 into memory 200. Control then passes to block 11 which calls tool 230, creates parasitics circuit 220, and installs it in memory 200. Estimator tool 250 is then activated, and control passes to block 12 where a victim circuit line is selected and an iterative process is initiated to develop an estimate of the induced voltage.

Block 13 selects an aggressor line, block 14 computes the estimated induced voltage due to the selected aggressor line (equation 4), and block 15 accumulates the estimated induced voltage. As long as aggressor lines remain that contribute more than an insignificant amount of induced voltage, e.g. within a certain physical distance from the victim line, block 16 returns control to block 13 to select another aggressor line. The result is that when block 16 passes control to block 17, the accumulated contribution developed by block 15 corresponds to the estimated peak induced voltage of equation 5.

Block 17 compares the developed peak induced voltage to a preselected threshold. When it is determined that the threshold has been exceeded, block 18 adds the identity of the victim circuit line to a list. Otherwise, or after addition to the list is effected, control passes to block 19 which determines whether they may be other victim circuit lines that have not been considered. When that is the case, control passes to block 12, where another victim line is selected.

When all circuit lines have been considered as victim circuit lines, control passes to block 20 where the circuit lines which are included in the list created by block 18 are considered. The induced voltage of those lines is again computed, but this time the computation is accurate rather than a mere estimation. This is done with tool 260. When, following the calculations of tool 260, it is determined that a modification of the integrated circuit layout is called for block 21 returns control to block 10 and with the aid of layout modifier tool 280 the layout is modified, and the process repeats.

Finally, when block 21 determines that no layout modifications are called for, control passes to block 22 where the image of the layout, in the format of a mask, for example, is created with tool 280 on display 120 or plotter 110.

It should be understood that the above disclosed the principles of this invention but modifications from the illustrative embodiment can be readily made without departing from the spirit and scope of this invention. For example, different tools can be employed that generate different types of parasitics circuits, inductive parasitics can be accounted for, etc.

We claim:

1. A method for improving a layout of an integrated circuit, where a memory contains information about circuit lines of said integrated circuit, comprising the steps of:

evaluating with a simplified analysis each of said circuit lines by developing, for each evaluated circuit line, an estimate of voltage induced in said evaluated circuit line, and comparing said estimate to a threshold; and flagging for more accurate analysis those of said circuit lines for which the estimate voltage is in excess of said threshold.

2. The method of claim 1 further comprising the steps of:

accurately analyzing those of said circuit lines that are flagged by said step of flagging; and developing a signal indicative of a need to redesign the circuit layout in response to said step of accurately analyzing.

3. A method carried out in a digital computer for enhancing a physical layout of an integrated circuit comprising the step of:

storing in memory of said digital computer a representation of the physical layout of said integrated circuit;

creating a representation of a parasitics circuit from said representation of said physical layout of said integrated circuit;

for each circuit line in said physical layout representation, performing an estimation of a peak induced voltage based on said parasitics circuit;

when circuit lines exist where the estimated peak voltage exceeds a threshold, modifying said representation of said physical layout, and returning to said step of creation a representation of a parasitics circuit;

when no circuit lines exist when the estimated peak voltage exceeds said threshold, creating an enhanced physical layout of said integrated circuit from the modified representation of said physical layout stored in said memory of said digital computer;

computing a voltage for said line based on a ratio of sums of RC constants that relate to capacitive couplings between different lines and the evaluated circuit line, where the number of terms in the numerator is lower than the number of terms in the denominator, the numerator being the factor that increases said voltage when it is increased;

accumulating the computed voltage for computations of all circuit lines that induce more than an insignificant voltage on the evaluated circuit line; and comparing the accumulated voltage to said preselected threshold.

4. The method of claim 3 where said step of computing a voltage computes $$e_{peak}(v, j) = \frac{k1 C(v, j) R(v)}{k2 C(v) R(v) + k3 C(j) R(j)},$$

where $e_{peak}(v,j)$ is the induced peak voltage at circuit line v due to coupling to circuit line j, k1, k2, and k3 are preselected constants, $C(v,j)$ is a capacitance measure between the evaluated circuit line, v, and a circuit line j, $R(v)$ is the resistance of circuit line v, $C(v)$ is the capacitance of circuit line v to ground, $R(j)$ is the resistance of circuit line j, and $C(j)$ is the capacitance of circuit line j to ground.

5. The method of claim 3 where said step of estimating comprises a step of quick estimation to identify circuit lines that exceed said threshold, followed by a step of confirming conclusions of the quick estimation step with calculations applied to the circuit lines identified by the quick estimation step that are more accurate that calculations applied in the quick estimation step.

6. The method of claim 5 where the step of quick estimation performs an evaluation of the expected induced peak signal for each circuit line, and in performing said evaluation performs the steps of:

computing a voltage for said line based on a ratio of sums of RC constants that relate to capacitive couplings between different lines and the evaluated circuit line, where the number of terms in the numerator is lower than the number of terms in the denominator;

accumulating the computed voltage for computations of all circuit lines that induce more than an insignificant voltage on the evaluated circuit line; and comparing the accumulated voltage to said preselected threshold.

7. The method of claim 6 where said step of computing a voltage computes $$e_{peak}(v, j) = \frac{k1 C(v, j) R(v)}{k2 C(v) R(v) + k3 C(j) R(j)},$$

where $e_{peak}(v, j)$ is the induced peak voltage at circuit line v due to coupling to circuit line j, k1, k2, and k3 are preselected constants, $C(v,j)$ is a capacitance measure between the evaluated circuit line v, and a circuit line j, $R(v)$ is the resistance of circuit line v, $C(v)$ is the capacitance of circuit line v to ground, $R(j)$ is the resistance of circuit line j, and $C(j)$ is the capacitance of circuit line j to ground.

8. A tool for improving a layout of an integrated circuit comprising:

a controller, maintained in a digital computer, for accessing information about circuit lines of said integrated circuit;

a processing unit, responsive to one of said circuit lines selected by said controller, that develops an estimate of a voltage induced in said selected circuit line, and compares said estimate to a threshold;

an exception reporting unit, responsive to said processing unit, which stores identity of those of said circuit lines for which the processing unit estimates a voltage in excess of said threshold;

a module for computing a voltage for said line based on a ratio of sums of RC constants that relate to capacitive couplings between different lines and the evaluated circuit line, where the number of terms in the numerator is lower than the number of terms in the denominator, the numerator being the factor that increases said voltage when it is increased;

a module for accumulating the computed voltage for computations of all circuit lines that induce more than an insignificant voltage on the evaluated circuit line; and a module for comparing the accumulated voltage to said preselected threshold.

9. The tool of claim 8, further comprising a second processing unit which accurately computes the voltage induced in those of said circuit lines that are stored by said exception reporting unit.

10. The tool of claim 8 further comprising a module for modifying said layout.

11. The tool of claim 8 further comprising a module for creating a printed image of said layout.

12. The tool of claim 8 where the processing unit develops said estimate for voltage induced in circuit line v by repetitively determining, for different circuit lines j, the value of $$e_{peak}(v, j) = \frac{k1C(v, j)R(v)}{k2C(v)R(v) + k3C(j)R(j)},$$

where $e_{peak}(v, j)$ is the induced peak voltage at circuit line v due to coupling to circuit line j, k1, k2, and k3 are preselected constants, C(v,j) is a capacitance measure between the evaluated circuit line, v, and a circuit line j, R(v) is the resistance of circuit line v, C(v) is the capacitance of circuit line v to ground, R(j) is the resistance of circuit line j, and C(j) is the capacitance of circuit line j to ground, and accumulating the determined voltages to obtain the value $$e_{peak}(v) = \sum_{j=1}^{M} e_{peak}(v, j).$$

13. Apparatus for creating a layout of an integrated circuit comprising:
   a memory;
   a processing unit;
   a code module stored in said memory for receiving circuit design and layout information and storing said information in said memory;
   a second code module stored in said memory for generating a circuit description of parasitic capacitances and resistances that are expected to be present in a circuit conforming to the circuit design and layout stored by said first tool;
   a third code module stored in said memory, responsive to the circuit description generated by said second code module, for estimating a voltage that is induced in a circuit line of said integrated circuit by neighboring circuit lines of said integrated circuit, and comparing the voltage estimates to a threshold;
   a fourth code module, responsive to said third code module, for modifying the circuit description and layout information stored by said first tool;
   a fifth code module for computing a voltage for said line based on a ratio of sums of RC constants that relate to capacitive couplings between different lines and the evaluated circuit line, where the number of terms in the numerator is lower than the number of terms in the denominator, the numerator being the factor that increases said voltage when it is increased;
   a sixth code module for accumulating the computed voltage for computations of all circuit lines that induce more than an insignificant voltage on the evaluated circuit line; and
   a seventh code module for comparing the accumulated voltage to said preselected threshold.

14. The apparatus of claim 13 wherein said fourth code module also reevaluates the voltage induced in a circuit line of said integrated circuit by neighboring circuit lines of said integrated circuit, with more precise calculations, for those circuit lines which said third code module determines that the estimated voltage exceeds said threshold.

15. The apparatus of claim 13 wherein said fourth code module performs said estimating of a voltage that is induced in a circuit line v of said integrated circuit by neighboring circuit lines j of said integrated circuit, by evaluating the equation $$e_{peak}(v) = \sum_{j=1}^{M} e_{peak}(v, j),$$

where
   $e_{peak}(v)$ is the estimate of the induced voltage;
   $e_{peak}(v, j)$ is the induced peak voltage at circuit line v due to coupling to circuit line j and is equal to $$\frac{k1C(v, j)R(v)}{k2C(v)R(v) + k3C(j)R(j)};$$

k1, k2, and k3 are preselected constants;
   C(v,j) is a capacitance measure between the evaluated circuit line, v, and a circuit line j;
   R(v) is the resistance of circuit line v;
   C(v) is the capacitance of circuit line v to ground;
   R(j) is the resistance of circuit line j; and
   C(j) is the capacitance of circuit line j to ground, and accumulating the determined voltages to obtain the value.

16. The apparatus of claim 13 further comprising an eighth code module for developing a printed image of said layout.

17. In a method for creating an integrated circuit including the steps of creating a circuit design, creating a layout conforming to the circuit design, analyzing each circuit line of said circuit design for voltage induced by parasitic capacitances and resistances, modifying the circuit layout to insure that none of said circuit lines develops an induced voltage in excess of a predetermined threshold, and creating said integrated circuit in accordance with the modified circuit layout, the improvement comprises:
   pre-analyzing each circuit line in the layout to develop an estimate of the voltage induced in the analyzed circuit line by parasitic capacitances and resistances in the circuit as laid out;
   restricting said step of analyzing each circuit line in the layout to analyze only those circuit lines in the layout for which said step of pre-analyzing develops an estimate of the voltage that exceeds said preselected voltage;
   computing a voltage for said line based on a ratio of sums of RC constants that relate to capacitive couplings between different lines and the evaluated circuit line, where the number of terms in the numerator is lower than the number of terms in the denominator, the numerator being the factor that increases said voltage when it is increased;
   accumulating the computed voltage for computations of all circuit lines that induce more than an insignificant voltage on the evaluated circuit line; and comparing the accumulated voltage to said preselected threshold.

18. A method for improving a layout of an integrated circuit, where a memory contains information about circuit lines of said integrated circuit, comprising the steps of:

evaluating with a simplified analysis each of said circuit lines by developing, for each evaluated circuit line, an estimate of voltage induced in said evaluated circuit line, and comparing said estimate to a threshold;

flagging for more accurate analysis those of said circuit lines for which the estimate voltage is in excess of said threshold, performing said more accurate analysis to develop a crosstalk voltage for said circuit lines, and when said crosstalk voltage is in excess of said threshold, returning to said step of evaluating.

* * * * *